(12) United States Patent
Song et al.

(10) Patent No.: US 10,539,820 B2
(45) Date of Patent: Jan. 21, 2020

(54) TOUCH-PANEL LIQUID CRYSTAL DISPLAY DEVICE

(71) Applicant: LG DISPLAY CO., LTD., Seoul (KR)

(72) Inventors: In-Duk Song, Gumi-si (KR); Chi-Hyuck Park, Paju-si (KR); Jin-Woo Choi, Gumi-si (KR); Sung-Ho Kim, Suwon-si (KR); Woo-Seock Lee, Gumi-si (KR); Haruhisa Iida, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/720,117

(22) Filed: Sep. 29, 2017

(65) Prior Publication Data

US 2018/0095317 A1 Apr. 5, 2018

(30) Foreign Application Priority Data

Sep. 30, 2016 (KR) .......................... 10-2016-0126763

(51) Int. Cl.
  *G02F 1/1333* (2006.01)
  *G06F 3/041* (2006.01)
  *G02F 1/1335* (2006.01)
  *H01L 27/12* (2006.01)

(52) U.S. Cl.
  CPC .... *G02F 1/13338* (2013.01); *G02F 1/133345* (2013.01); *G02F 1/133514* (2013.01); *G06F 3/0412* (2013.01); *H01L 27/1214* (2013.01)

(58) Field of Classification Search
  CPC ................... G06F 3/047; G06F 3/0412; G06F 2203/04103; G02F 1/133345; G02F 1/133514; G02F 1/13338; H01L 27/1214
  See application file for complete search history.

(56) References Cited

U.S. PATENT DOCUMENTS

| 2007/0132937 | A1* | 6/2007 | Lee ..................... G02F 1/13394 349/156 |
| 2015/0185566 | A1* | 7/2015 | Choi ................. G02F 1/134336 349/42 |
| 2015/0378494 | A1* | 12/2015 | Cok ..................... G06F 3/0416 345/174 |

* cited by examiner

*Primary Examiner* — Yaron Cohen
(74) *Attorney, Agent, or Firm* — Birch, Stewart, Kolasch & Birch, LLP

(57) ABSTRACT

A touch-panel liquid-crystal display device in one embodiment includes a metal line formed on a thin-film transistor array substrate, a gap column spacer and a push column spacer on a portion of a color filter array substrate that corresponds to an intersection of gate and data lines of the thin-film transistor array substrate, and a liquid-crystal layer between the thin-film transistor array substrate and the color filter array substrate. The gap column spacer and the push column spacer have the same height and the gap column spacer is located on the metal line, which facilitates an exposure process, minimizes generation of foreign substances when printing an alignment layer, and enables adjustment of the optimum amount of liquid crystals when liquid-crystal dotting is performed. The push column spacer is located on the metal line when the device can be pushed or bent by external force, and thus increases panel rigidity.

15 Claims, 5 Drawing Sheets

TOUCH-PANEL LIQUID CRYSTAL DISPLAY DEVICE

CROSS-REFERENCE TO RELATED APPLICATION

This application claims the priority benefit of Korean Patent Application No. 10-2016-0126763, filed on Sep. 30, 2016, which is hereby incorporated by reference as if fully set forth herein.

BACKGROUND OF THE INVENTION

Field of the Invention

The present invention relates to a touch-panel liquid-crystal display device, and more particularly, to a touch-panel liquid-crystal display device in which a gap column spacer, which maintains a gap between two bonded substrates, and a push column spacer, which serves to sense a touch, have the same height, and in which the gap column spacer is located on a metal line so as to enable adjustment of the optimum amount of liquid crystals upon liquid-crystal dotting.

Discussion of the Related Art

With the development of multimedia, the importance of flat panel display devices is increasing. In response to this, flat panel display devices such as a liquid-crystal display device, a plasma display device, and an organic light-emitting display device have been commercialized.

Among these flat panel display devices, a liquid-crystal display device is widely used as a portable flat panel display device owing to several advantages thereof, such as high image quality, a low weight, a small thickness, and low power consumption, and in particular, is used for various applications such as a laptop computer, a computer monitor, and a television.

A touch-panel liquid-crystal display device having a touch panel stacked thereon has widely been used and is formed by stacking touch panels. When a user touches the touch panel with the hand, a stylus pen or the like, electrical characteristics such as resistance or capacitance vary at a touch point. The touch-panel liquid-crystal display device senses the touch point, thereby outputting information corresponding to the touch point or performing an arithmetic operation.

The touch-panel liquid-crystal display device described above is one of various user interfaces, and the application range thereof has expanded to small portable terminals, office equipment, mobile phones, and the like.

However, due to the fact that the touch panel is separately stacked on the liquid crystal display device, there is a limitation in achieving thinness due to an increase in overall thickness, light transmission efficiency is reduced when light passes through the stacked panel, and production costs are increased.

In order to address the problems described above, an in-cell-type touch-panel liquid-crystal display device has been proposed, in which a touch sensor is mounted in a pixel area of the liquid-crystal display device.

FIG. 1 is a cross-sectional view of an in-cell-type touch-panel liquid-crystal display device 10 according to a related art.

Referring to FIG. 1, the in-cell-type touch-panel liquid-crystal display device 10 includes a thin-film transistor array substrate 11, a color filter array substrate 21, and a liquid-crystal layer 17 disposed between the thin-film transistor array substrate 11 and the color filter array substrate 21.

The thin-film transistor array substrate 11 includes a gate line 12 disposed in a given direction, a gate insulation layer 18 disposed to cover the gate line 11, a data line 13 disposed on the gate insulation layer 18 in a direction orthogonal to the gate line 12, and a lower planarization layer 14, an insulation layer 15, and a lower alignment layer 16b, which are sequentially formed on the data line 13.

The color filter array substrate 21 includes a black matrix 22 for preventing color mixing between sub-pixels, a color filter layer 23 formed in each pixel area between neighboring portions of the black matrix 22, an upper planarization layer 24 formed on the color filter layer 23, a push column spacer 25 and a gap column spacer 26, which are formed on the upper planarization layer 24 so as to correspond to each intersection of the gate line 12 and the data line 13 of the thin-film transistor array substrate 11, and an upper alignment layer 16a formed over the entire surface on which the push column spacer 25 and the gap column spacer 26 have been formed.

Here, the gap column spacer 26 is formed so as to be brought into contact with the thin-film transistor array substrate 11 and serves to maintain a gap between the thin-film transistor array substrate 11 and the color filter array substrate 21.

The push column spacer 25 is formed so as to be spaced apart from the thin-film transistor array substrate 11.

That is, the height of the gap column spacer 26 is higher than the height of the push column spacer 25.

However, the touch-panel liquid-crystal display device described above has the following problems and limitations.

First, because the gap column spacer and the push column spacer are formed to have different heights by photo-lithography and etching processes using a half-tone mask, uniform adjustment and management of the height difference are difficult during an exposure process.

Second, when or after printing the upper alignment layer, foreign substances may be generated due to the height difference between the gap column spacer and the push column spacer, which may cause deterioration in image quality.

Third, due to the height difference between the gap column spacer and the push column spacer, it is impossible or difficult to adjust the optimum amount of liquid crystals when the liquid crystals are disposed.

SUMMARY OF THE INVENTION

Accordingly, the present invention is directed to a touch-panel liquid-crystal display device that substantially obviates one or more problems due to limitations and disadvantages of the related art.

One object of the present invention is to provide a touch-panel liquid-crystal display device in which a gap column spacer, which maintains a gap between two substrates, and a push column spacer, which serves to sense a touch, have the same height and in which the gap column spacer is located on a metal line, which may ensure easy implementation of an exposure process, may minimize the generation of foreign substances during printing of an alignment layer, and may allow adjustment of the optimum amount of liquid crystals upon liquid-crystal dotting.

Another object of the present invention is to provide a touch-panel liquid-crystal display device in which a push column spacer, which serves to sense a touch, is spaced apart from a thin-film transistor array substrate by a predetermined distance in a normal state, but is located on a metal line when the liquid-crystal display device can be pushed or bent by external force, which may increase the rigidity of a panel.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a touch-panel liquid-crystal display device includes a thin-film transistor array substrate on which a plurality of gate lines and a plurality of data lines are arranged to intersect each other so as to define pixel areas, and a thin-film transistor on each pixel area, a metal line on the thin-film transistor array substrate, a color filter array substrate on which a color filter layer is formed on each pixel area, a gap column spacer and a push column spacer on the color filter array substrate in a portion that corresponds to each intersection of the gate lines and the data lines of the thin-film transistor array substrate, and a liquid-crystal layer disposed between the thin-film transistor array substrate and the color filter array substrate, wherein the gap column spacer overlaps the metal line.

Here, the gap column spacer and the push column spacer may have the same height.

The metal line may be parallel to a corresponding one of the data lines, may overlap the corresponding data line, and may be cut in an area thereof that corresponds to the push column spacer.

The touch-panel liquid-crystal display device may further include a pixel electrode on each pixel area of the thin-film transistor array substrate and a common electrode on the color filter array substrate.

The touch-panel liquid-crystal display device may further include a common electrode on the thin-film transistor array substrate and a pixel electrode on each pixel area of the thin-film transistor array substrate, where the pixel electrode has a slit.

The touch-panel liquid-crystal display device may further include a pixel electrode and a common electrode on each pixel area of the thin-film transistor array substrate.

The metal line may be one of a common line that supplies a common voltage to the common electrode and a sensing line that senses a touch.

The push column spacer may maintain a distance ranging from 3 μm to 6 μm from a cut portion of the metal line and the metal line, which is close thereto.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, a touch-panel liquid-crystal display device according to various embodiments of the present invention, having features described above, will be described in more detail with reference to the accompanying drawings.

Figure 1:
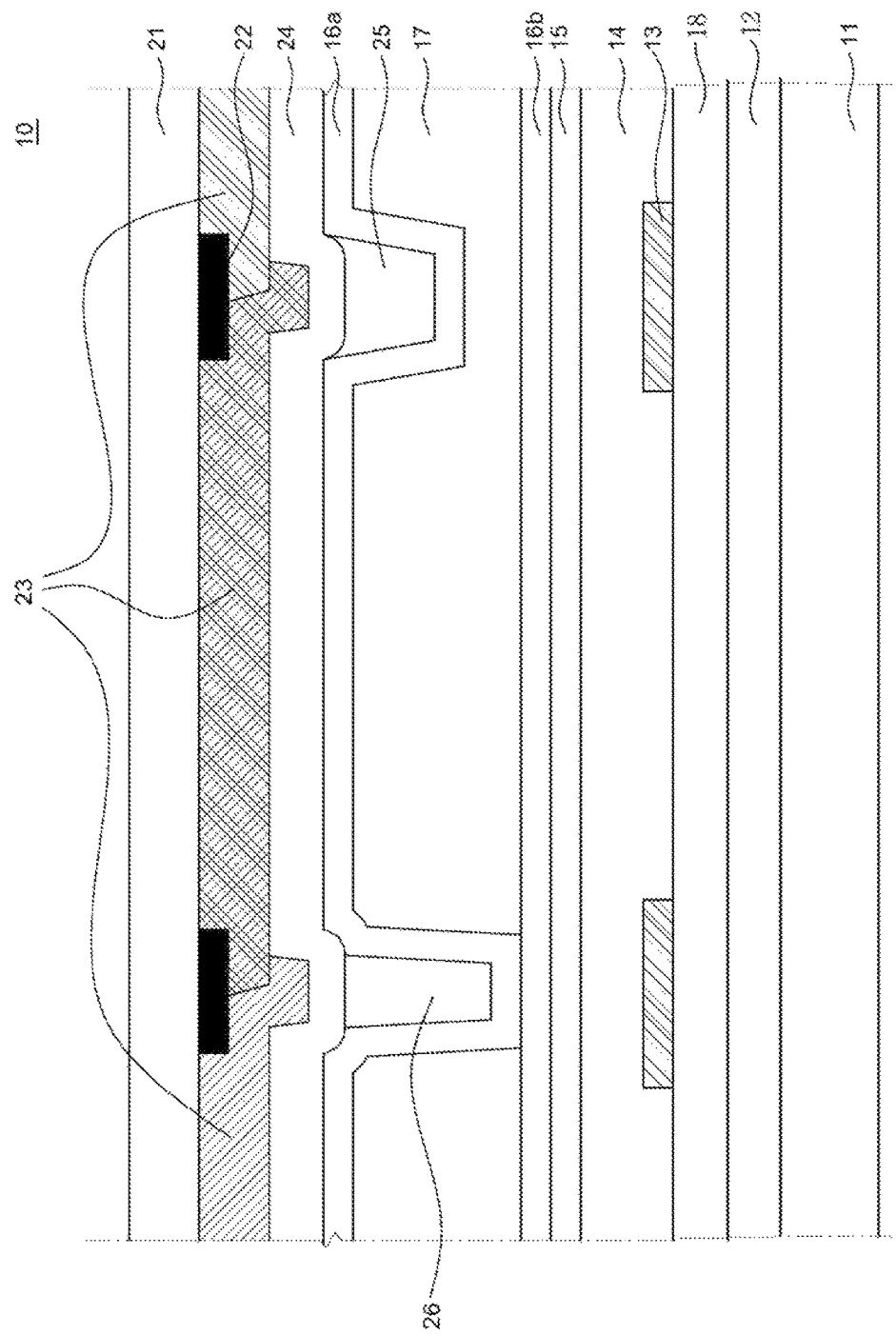
FIG. 1 is a cross-sectional view illustrating the structure of an in-cell-type touch-panel liquid-crystal display device according to a related art.
Figure 2:
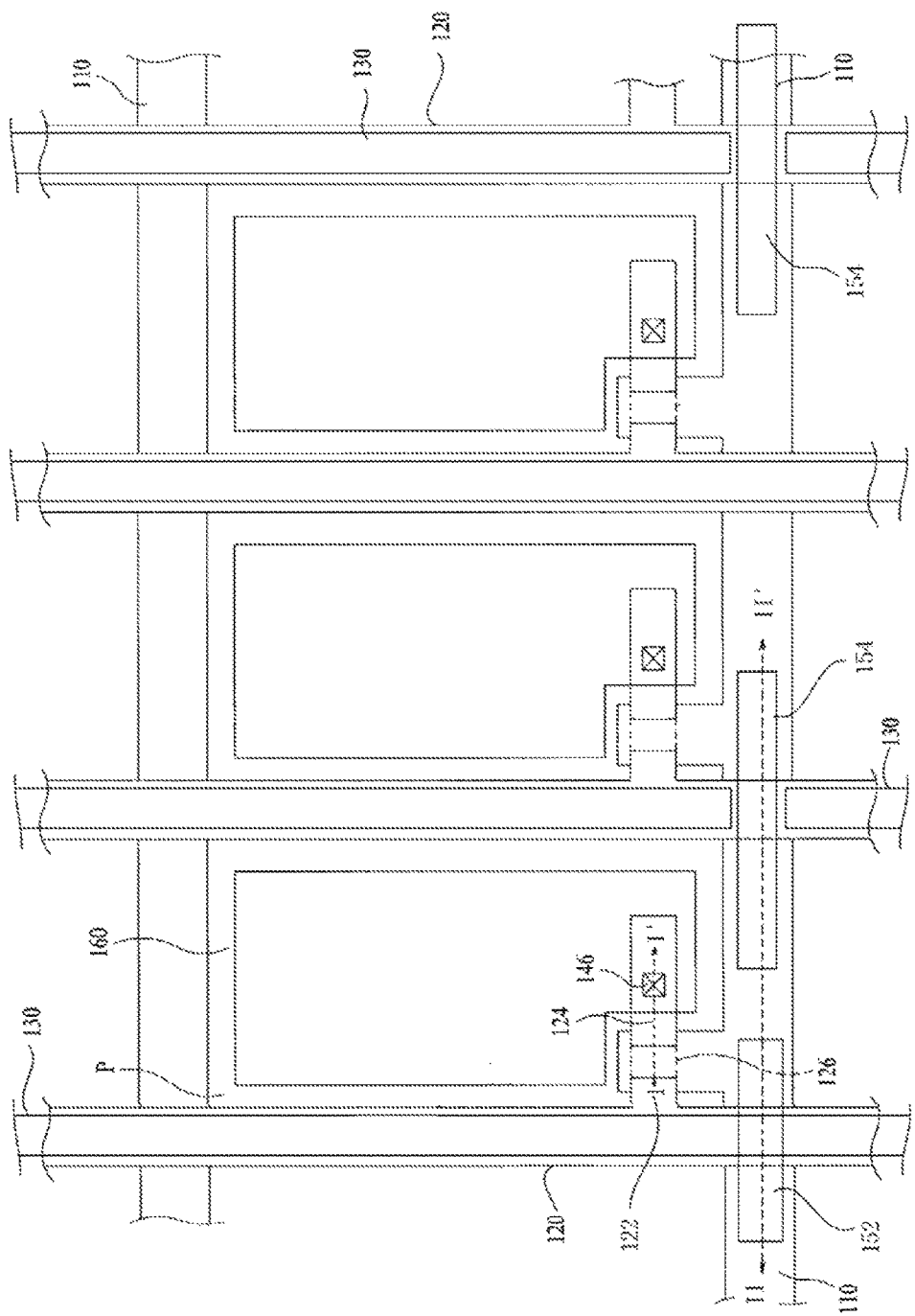
FIG. 2 is a layout diagram of a touch-panel liquid-crystal display device according to a first embodiment of the present invention.
Figure 3:
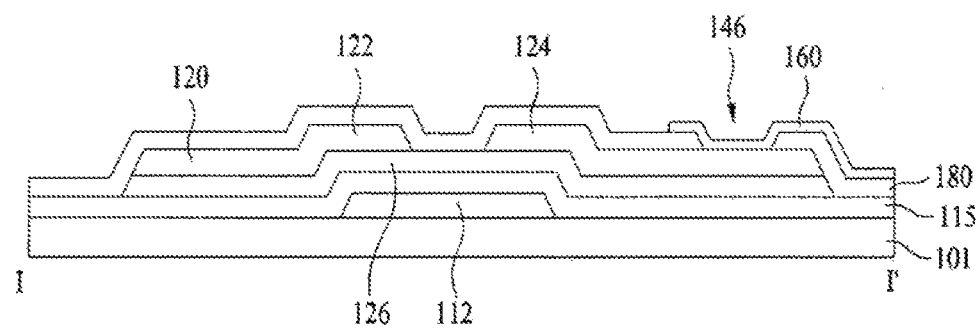
FIG. 3 is a cross-sectional view taken along line I-I' of FIG. 2, illustrating a thin-film transistor array substrate according to the first embodiment of the present invention.
Figure 4:
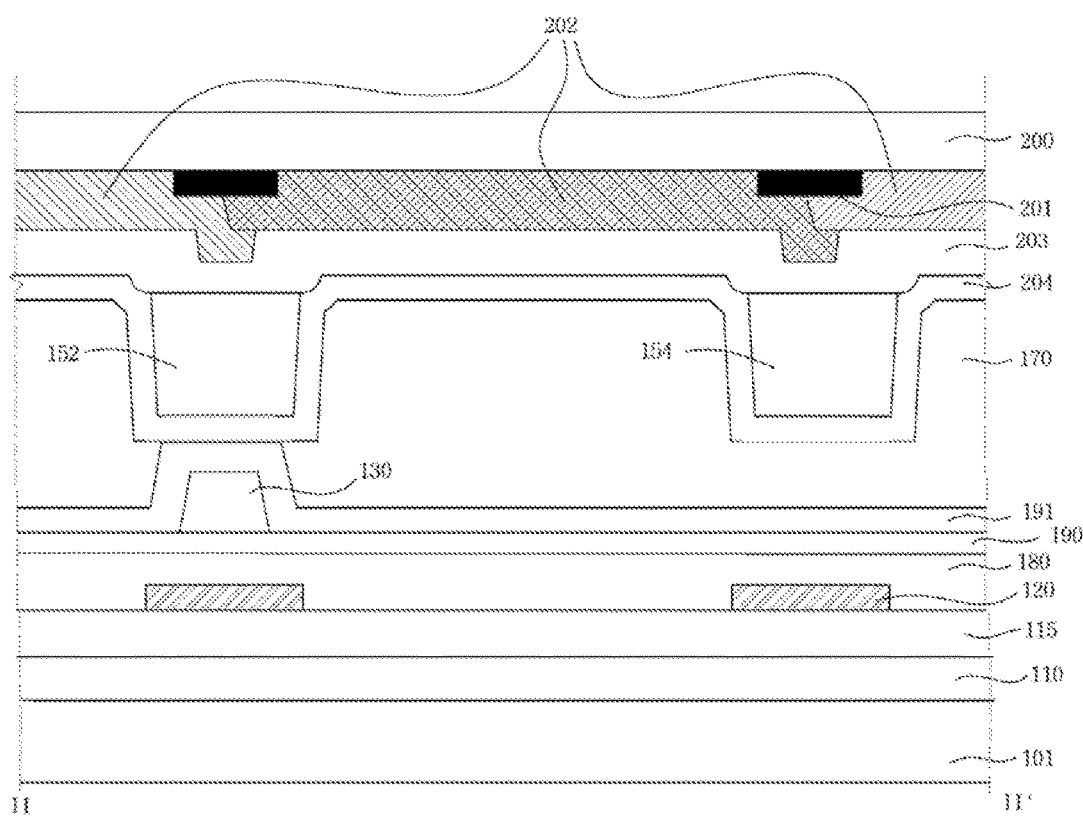
FIG. 4 is a cross-sectional view taken along line II-II' of FIG. 2.

FIG. 2 is a layout diagram of the touch-panel liquid-crystal display device according to an embodiment of the present invention, FIG. 3 is a cross-sectional view taken along line I-I' of FIG. 2, illustrating a thin-film transistor array substrate according to a first embodiment of the present invention, and FIG. 4 is a cross-sectional view taken along line II-II' of FIG. 2. All the components of the touch-panel liquid-crystal display device according to all embodiments of the present invention are operatively coupled and configured.

The touch-panel liquid-crystal display device according to the first embodiment of the present invention, as illustrated in FIGS. 2 to 4, includes a first substrate 101 that is a thin-film transistor array substrate, a second substrate 200 that is a color filter array substrate, and a liquid-crystal layer 170 that fills between the first and second substrates 101 and 200.

First, the configuration of the thin-film transistor array substrate will be described below.

A plurality of gate lines 110, which extends in a given direction, and a gate electrode 112 are formed on the first substrate 101.

A gate insulation layer 115 is formed on an entire surface of the first substrate 101 so as to cover the gate lines 110 and the gate electrode 112. Then, a plurality of data lines 120 is formed on the gate insulation layer 115 so as to intersect the respective gate lines 110, thereby defining pixel areas P. A thin-film transistor is formed in each pixel area P at which the corresponding gate and data lines 110 and 120 intersect each other.

Here, the thin-film transistor includes the gate electrode 112 protruding from the gate line 110, the gate insulation layer 115 on the entire surface of the first substrate 101, a semiconductor layer 126 formed on the gate insulation layer 115 so as to be located above the gate electrode 112, a source electrode 122 protruding from the data line 120 to one side of the semiconductor layer 126, and a drain electrode 124 formed on the opposite side of the semiconductor layer 126 so as to be spaced apart from the source electrode 122.

A protective layer 180 is formed on the entire surface of the first substrate 101 on which the thin-film transistor has been formed. A contact hole 146 is formed by selectively removing a portion of the protective layer 180 on the drain electrode 124 of the thin-film transistor, and a pixel electrode 160 is formed on each pixel area P so as to be electrically connected to the drain electrode 124 of the thin-film transistor through the contact hole 146.

An insulation layer 190 is formed on the entire substrate surface on which the pixel electrode 160 has been formed. Then, a plurality of metal lines 130 is formed on the insulation layer 190 so as to be located above the data lines 120. That is, the metal lines 130 are disposed parallel to the data lines 120 and overlap the data lines 120. A lower alignment layer 191 is formed on the entire surface of the insulation layer 190 on which the metal lines 130 have been formed.

As illustrated in FIG. 2, some of the metal lines 130 are cut in the portion in which the gate line 110 and the data line 120 overlap each other.

Next, the color filter array substrate will be described below.

As illustrated in FIG. 4, a black matrix 201 is formed on the second substrate 200 to prevent color mixing between sub-pixels, and an R, G and B color filter layers 202 are formed in each pixel area between neighboring portions of the black matrix 201. A planarization layer 203 is formed on the color filter layers 202. Then, a gap column spacer 152 and a push column spacer 154 are formed on the planarization layer 203 so as to correspond to each intersection of the gate line 110 and the data line 120 of the thin-film transistor array substrate 101. Then, an upper alignment layer 204 is formed over the entire surface of the planarization layer 203 on which the gap column spacer 152 and the push column spacer 154 have been formed.

Here, the gap column spacer 152 is brought into contact with the lower alignment layer 191 on the metal line 130, which is formed on the thin-film transistor array substrate 101, so as to maintain a gap between the thin-film transistor array substrate 101 and the color filter array substrate 200.

The push column spacer 154 serves to sense a touch, and is formed in the portion, in which the metal line 130 of the thin-film transistor array substrate 101 is cut, so as to be spaced apart from the thin-film transistor array substrate 101.

That is, although the gap column spacer 152 and the push column spacer 154 have the same height, due to the height difference provided by the metal line 130, the gap column spacer 152 is brought into contact with the thin-film transistor array substrate 101, whereas the push column spacer 154 is spaced apart from the thin-film transistor array substrate 101.

When the touch-panel liquid-crystal display device of the present invention is formed in a TN mode, a common electrode may further be formed on the R, G and B color filter layer 202.

Here, the metal line 130 may be a dummy line and may be a touch sensing line to sense a touch.

The touch-panel liquid-crystal display device of the present invention may be applied to all liquid crystal display devices of an IPS mode, an FFS mode, and the like, in addition to the TN mode.

Figure 5:
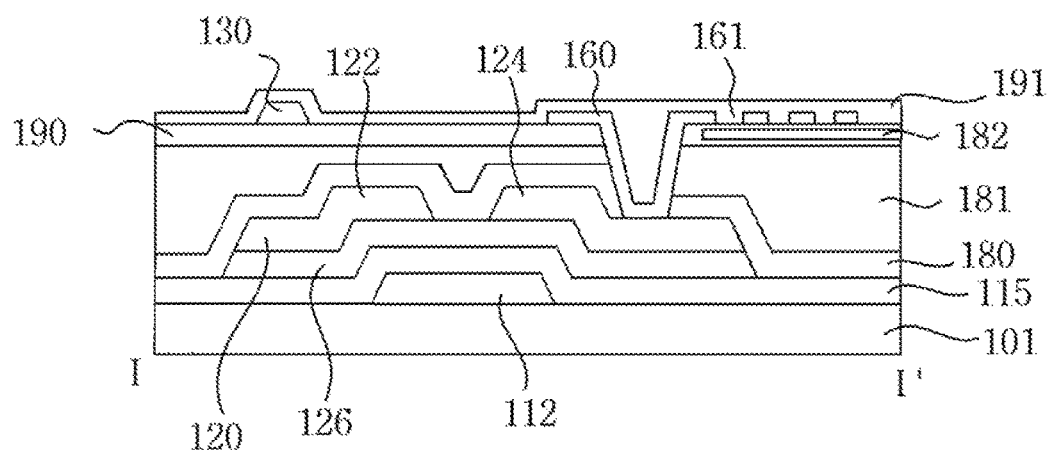
FIG. 5 is a cross-sectional view taken along line I-I' of FIG. 2, illustrating a thin-film transistor array substrate according to a second embodiment of the present invention.

FIG. 5 is a cross-sectional view taken along line I-I' of FIG. 2, illustrating a thin-film transistor array substrate according to a second embodiment of the present invention.

FIG. 5 illustrates the cross section of the thin-film transistor array substrate of an FFS mode touch-panel liquid-crystal display device.

That is, the plurality of gate lines 110, which extends in a given direction, and the gate electrode 112 are formed on the first substrate 101.

Referring to FIG. 5, the gate insulation layer 115 is formed on the entire surface of the first substrate 101 so as to cover the gate lines 110 and the gate electrode 112. Then, the plurality of data lines 120 is formed on the gate insulation layer 115 so as to intersect the respective gate lines 110, thereby defining pixel areas P. A thin-film transistor is formed in each pixel area P at which the corresponding gate and data lines 110 and 120 intersect each other.

Here, the thin-film transistor includes the gate electrode 112 protruding from the gate line 110, the gate insulation layer 115 on the entire surface of the first substrate 101, the semiconductor layer 126 on the gate insulation layer 115 so as to be located above the gate electrode 112, the source electrode 122 protruding from the data line 120 to one side of the semiconductor layer 126, and the drain electrode 124 on the opposite side of the semiconductor layer 126 so as to be spaced apart from the source electrode 122.

The protective layer 180, a planarization layer 181, and the insulation layer 190 are sequentially formed on the entire surface of the first substrate 101 on which the thin-film transistor has been formed. In addition, a common electrode 182 is formed on the entire surface of the insulation layer 190. The common electrode 182 is formed on the entire surface excluding the top of the thin-film transistor and a contact hole area in which the pixel electrode and the drain electrode are brought into contact with each other. In addition, the insulation layer 190 is additionally formed on the entire surface on which the common electrode 182 has been formed.

The contact hole 146 is formed by selectively removing the protective layer 180, the planarization layer 181 and the insulation layer 190, which are located on the drain electrode 124 of the thin-film transistor, and the pixel electrode 160 is formed on each pixel area P so as to be electrically connected to the drain electrode 124 of the thin-film transistor through the contact hole 146.

At this time, the pixel electrode 160 has slits 161 to form a fringe field.

The plurality of metal lines 130 is formed on the insulation layer 190 so as to be located above the data lines 120. That is, the metal lines 130 are disposed parallel to the data lines 120 and overlap the data lines 120. The lower alignment layer 191 is formed on the entire surface of the insulation layer 190 on which the metal lines 130 have been formed.

Likewise, as illustrated in FIG. 2, some of the metal lines 130 are cut in the portion in which the gate line 110 and the data line 120 overlap each other.

A color filter array substrate of the FFS mode touch-panel liquid-crystal display device is the same as that illustrated in FIG. 4, and thus a description thereof will be omitted.

Here, the metal lines 130 may be a dummy line and may be a common line for applying a common voltage to the common electrode 182. When the metal line 130 is used as the common line as described above, the metal line 130 and the common electrode 182 are electrically connected to each other through a contact hole, which is formed in the insulation layer 190 so as to expose a portion of the common electrode 182.

In addition, the metal line 130 may be a touch sensing line for sensing a touch.

Figure 6:
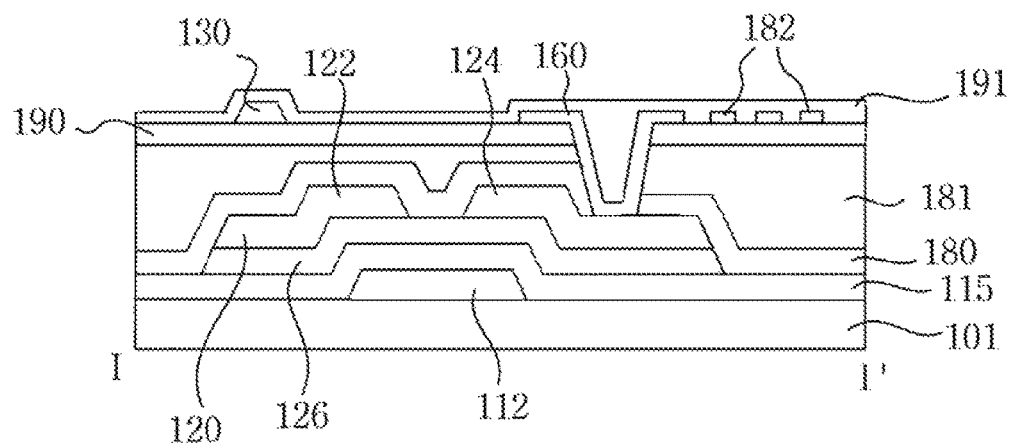
FIG. 6 is a cross-sectional view taken along line I-I' of FIG. 2, illustrating a thin-film transistor array substrate according to a third embodiment of the present invention.

FIG. 6 is a cross-sectional view taken along line I-I' of FIG. 2, illustrating a thin-film transistor array substrate according to a third embodiment of the present invention.

FIG. 6 illustrates the cross section of the thin-film transistor array substrate of an IPS mode touch-panel liquid-crystal display device.

That is, the plurality of gate lines 110, which extends in a given direction, and the gate electrode 112 are formed on the first substrate 101.

Referring to FIG. 6, the gate insulation layer 115 is formed on the entire surface of the first substrate 101 so as to cover the gate lines 110 and the gate electrode 112. Then, the plurality of data lines 120 is formed on the gate insulation layer 115 so as to intersect the respective gate lines 110, thereby defining pixel areas P. A thin-film transistor is formed in each pixel area P at which the corresponding gate and data lines 110 and 120 intersect each other.

Here, the thin-film transistor includes the gate electrode 112 protruding from the gate line 110, the gate insulation layer 115 on the entire surface of the first substrate 101, the semiconductor layer 126 formed on the gate insulation layer 115 so as to be located above the gate electrode 112, the source electrode 122 protruding from the data line 120 to one side of the semiconductor layer 126, and the drain electrode 124 formed on the opposite side of the semiconductor layer 126 so as to be spaced apart from the source electrode 122.

The protective layer 180, the planarization layer 181, and the insulation layer 190 are sequentially formed on the entire surface of the first substrate 101 on which the thin-film transistor has been formed.

The contact hole 146 is formed by selectively removing the protective layer 180, the planarization layer 181 and the insulation layer 190, which are located on the drain electrode 124 of the thin-film transistor, and pixel electrodes 160 of a comb structure are formed on each pixel area P so as to be electrically connected to the drain electrode 124 of the thin-film transistor through the contact hole 146. Common electrodes 182 are formed between the pixel electrodes 160 of a comb structure so as to create a transverse electric field.

The plurality of metal lines 130 is formed on the insulation layer 190 so as to be located above the data lines 120. That is, the metal lines 130 are disposed parallel to the data lines 120 and overlap the data lines 120. The lower alignment layer 191 is formed on the entire surface of the insulation layer 190 on which the metal lines 130 have been formed.

Likewise, as illustrated in FIG. 2, some of the metal lines 130 are cut in the portion in which the gate line 110 and the data line 120 overlap each other.

A color filter array substrate of the IPS mode touch-panel liquid-crystal display device is the same as that illustrated in FIG. 4, and thus a description thereof will be omitted.

Here, the metal lines 130 may be a dummy line and may be a common line for applying a common voltage to the common electrode 182. When the metal line 130 is used as the common line as described above, the metal line 130 and the common electrode 182 are electrically connected to each other through a contact hole (not illustrated), which is formed in the insulation layer 190 so as to expose a portion of the common electrode 182.

In addition, the metal line 130 may be a touch sensing line for sensing a touch.

In FIGS. 2 to 6, the metal line 130 is illustrated as having a width smaller than the width of the data line 120, but the embodiment is not limited thereto. For example, the width of the metal line 130 may be the same as the width of the data line 120, or may be wider than the width of the data line 120.

Figure 7:
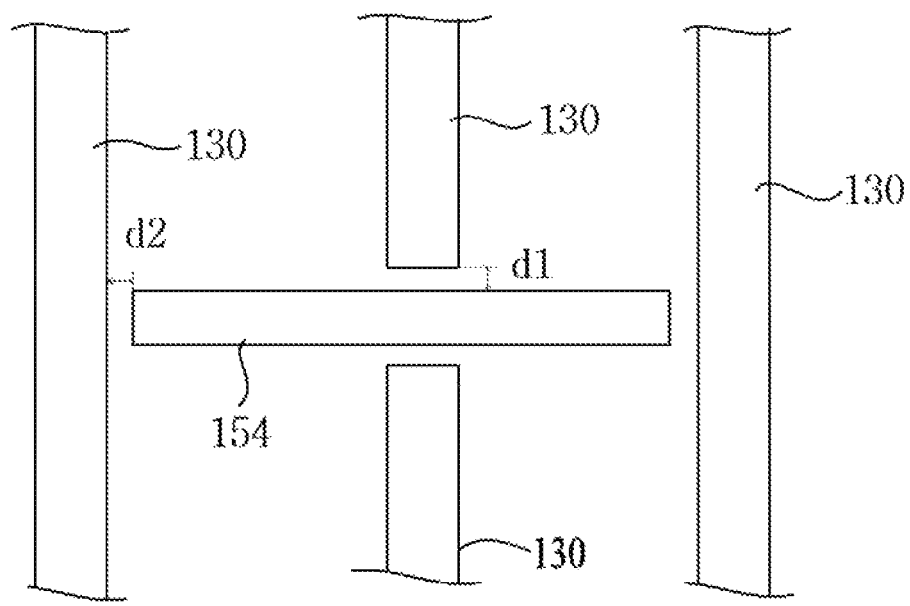
FIG. 7 is a layout diagram of the liquid-crystal display device illustrating a push column spacer and metal lines according to an embodiment of the present invention.

FIG. 7 is a layout diagram of the liquid crystal display device illustrating the push column spacer and the metal lines according to the present invention.

Referring to FIG. 7, as described above, the push column spacer 154 is formed on a portion of the color filter array substrate that corresponds to the portion of the thin-film transistor array substrate 101 in which the metal line 130 is cut at the intersection of the gate line and the data line.

At this time, the push column spacer 154 is designed so as to be close to each metal line 130 in consideration of a bonding margin of the thin-film transistor array substrate 101 and the color filter array substrate 200.

That is, the push column spacer 154 is designed so that a distance d1 between the push column spacer 154 and the end of the cut metal line 130 and a distance d2 between the push column spacer 154 and the metal line 130 that is not cut are substantially within a range from 3 µm to 6 µm.

Due to the configuration/design of the push column spacer 154 described above, the push column spacer 154 is spaced apart from the thin-film transistor array substrate by a predetermined distance in a normal state, but is located on the metal line 130 when the liquid crystal display device is pushed or bends by external force, which may increase the rigidity of a liquid crystal panel.

As is apparent from the above description, a touch-panel liquid-crystal display device according to the embodiments of the present invention has the following effects.

First, because a gap column spacer and a push column spacer have the same height, the gap column spacer and the push column spacer may be easily formed.

Second, when the gap column spacer and the push column spacer have the same height, the efficiency of printing of an alignment layer may be increased when an upper alignment layer is printed, which may prevent deterioration in image quality due to any foreign substances generated during printing.

Third, because the gap column spacer and the push column spacer have the same height, the optimum amount of liquid crystals may be adjusted when the liquid crystals are disposed.

Fourth, when the liquid crystal display device is pushed or bends by external force, the push column spacer may be located on a dummy line, a common line that supplies a common voltage, or a sensing line that senses a touch, which may increase the rigidity of a liquid crystal panel.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention.

What is claimed is:

1. A touch-panel liquid-crystal display device comprising:
   a thin-film transistor array substrate on which a plurality of gate lines and a plurality of data lines are arranged to intersect each other so as to define pixel areas, each pixel area including a thin film transistor;
   a metal line formed on the thin-film transistor array substrate;
   a color filter array substrate on which a color filter layer is formed on each pixel area;
   a gap column spacer on the color filter array substrate and overlapping with an intersection between one of the plurality of gate lines and one of the plurality of data lines of the thin-film transistor array substrate, the gap column spacer overlapping with the metal line;

a push column spacer on the color filter array substrate and overlapping with another intersection between the one of the plurality of gate lines and another one of the plurality of data lines of the thin-film transistor array substrate; and a liquid-crystal layer disposed between the thin-film transistor array substrate and the color filter array substrate, wherein the metal line is parallel to a corresponding one of the data lines, overlaps the corresponding data line, and the metal line is cut in an area thereof that corresponds to the push column spacer.

2. The touch-panel liquid-crystal display device according to claim 1, wherein the gap column spacer and the push column spacer have a same height.

3. The touch-panel liquid-crystal display device according to claim 1, wherein the metal line is one of a dummy line, a common line that supplies a common voltage, and a sensing line that senses a touch.

4. The touch-panel liquid-crystal display device according to claim 1, further comprising:
a pixel electrode on each pixel area of the thin-film transistor array substrate; and
a common electrode on the color filter array substrate.

5. The touch-panel liquid-crystal display device according to claim 1, further comprising:
a common electrode on the thin-film transistor array substrate; and
a pixel electrode on each pixel area of the thin-film transistor array substrate and having a slit.

6. The touch-panel liquid-crystal display device according to claim 5, wherein the metal line is either a common line that supplies a common voltage to the common electrode, or a sensing line that senses a touch.

7. The touch-panel liquid-crystal display device according to claim 1, further comprising:
a pixel electrode and a common electrode both on each pixel area of the thin-film transistor array substrate.

8. The touch-panel liquid-crystal display device according to claim 7, wherein the metal line is either a common line that supplies a common voltage to the common electrode, or a sensing line that senses a touch.

9. The touch-panel liquid-crystal display device according to claim 1, wherein the push column spacer maintains a distance ranging from approximately 3 µm to approximately 6 µm from a cut portion of the metal line and the metal line, which is close thereto.

10. The touch-panel liquid-crystal display device according to claim 1, wherein a first imaginary line intersects through the one of the plurality of gate lines, the one of the plurality of data lines, the metal line, the gap column spacer, the color filter layer and a black matrix, in a vertical direction.

11. The touch-panel liquid-crystal display device according to claim 1, wherein a second imaginary line intersects through the one of the plurality of gate lines, the another one of the plurality of data lines, the push column spacer, the color filter layer and a black matrix, in a vertical direction.

12. The touch-panel liquid-crystal display device according to claim 1, wherein the gap column spacer has a long side and a short side that is shorter than the long side of the gap column spacer, and the push column spacer has a long side and a short side that is shorter than the long side of the push column spacer,
wherein the gap column spacer and the push column spacer are both parallel to the one of the plurality of gate lines, and
wherein the long side of the gap column spacer, the long side of the push column spacer and the one of the plurality of gate lines are arranged along a same imaginary line.

13. The touch-panel liquid-crystal display device according to claim 1, wherein the metal line includes a cutout portion disposed between adjacent portions of the metal line, and
wherein the push column spacer is located between the adjacent portions of the metal line in the cutout portion.

14. The touch-panel liquid-crystal display device according to claim 1, wherein the metal line is a touch sensing line, and
wherein the push column spacer serves to sense a touch and corresponds to a cutout portion of the metal line.

15. A touch-panel liquid-crystal display device comprising:
a thin-film transistor array substrate including a gate line, a first data line, a second data line and a thin film transistor;
a metal line disposed on the thin-film transistor array substrate;
a gap column spacer overlapping with a first intersection between the gate line and the first data line, and overlapping with the metal line;
a push column spacer overlapping with a second intersection between the gate line and the second data line; and
a liquid-crystal layer overlapping the thin-film transistor array substrate,
wherein the metal line is parallel to the second data line, overlaps the second data line, and the metal line is cut in an area thereof that corresponds to the push column spacer.

* * * * *